United States Patent
Kinget et al.

(10) Patent No.: US 6,671,341 B1
(45) Date of Patent: Dec. 30, 2003

(54) GLITCH-FREE PHASE SWITCHING SYNTHESIZER

(75) Inventors: Peter Kinget, Aliso Viejo, CA (US); Nagendra Krishnapura, New York, NY (US)

(73) Assignee: Agere Systems, Inc., Berkeley Heights, NJ (US)

( * ) Notice: Subject to any disclaimer, the term of this patent is extended or adjusted under 35 U.S.C. 154(b) by 0 days.

(21) Appl. No.: 09/398,371

(22) Filed: Sep. 17, 1999

(51) Int. Cl.[7] .................................................. H03D 3/24
(52) U.S. Cl. ...................................... 375/373; 375/376
(58) Field of Search ................................ 375/354, 371, 375/373, 376; 327/115, 117, 147; 377/47, 48

(56) References Cited

U.S. PATENT DOCUMENTS

| | | | |
|---|---|---|---|
| 5,150,390 A | * | 9/1992 | Hayashi et al. ............. 327/117 |
| 5,416,446 A | * | 5/1995 | Holler et al. ................ 327/114 |

FOREIGN PATENT DOCUMENTS

| | | | | |
|---|---|---|---|---|
| GB | 2233132 A | * | 1/1991 | .......... H03K/21/00 |

OTHER PUBLICATIONS

J. Craninckx and M. S. J. Steyaert, "A 1.75–Ghz/3–V Dual–Modulus Divide–by–128/129 Prescaler in 0.7–pm CMOS" IEEE Journal of Solid State Circuits, vol. 31, No. 7, pp. 890–897, Jul. 1996.

J. Yuan and C. Svensson, "High–Speed CMOS Circuit Technique", IEEE Journal of Solid State Circuits, vol. 24, No. 1, pp. 62–70, Feb. 1989.

B. Razavi et al., "Design of High–Speed, Low–Power Frequency Dividers and Phase Locked Loops in Deep Submicron CMOS", IEEE Journal of Solid State Circuits, vol. 30, No. 2, pp. 101–109, Feb. 1995.

M. Kurisu et al., "An 11.8 Ghz–mW CMOS frequency Divider", 1997 Symposium on VLSI Circuits Digest of Technical Papers, pp. 73–74.

N. Foroudi and T. Kwasniewski, "CMOS High–Speed Dual–Modulus Frequency Divider for RF Frequency Synthesis", IEEE Journal of Solid State Circuits, vol. 30, No. 2, pp. 93–100, Feb. 1995.

Hong–Ih Cong et al., "Multigigahertz CMOS Dual–Modulus Prescalar IC", IEEE Journal of Solid State Circuits, vol. 23, No. 5, pp. 1189–1194, Oct. 1988.

* cited by examiner

Primary Examiner—Stephen Chin
Assistant Examiner—David B. Lugo
(74) Attorney, Agent, or Firm—Harness, Dickey & Pierce, P.L.C.

(57) ABSTRACT

A system for generating a glitch-free output signal having a frequency. The system comprises a frequency divider for receiving a signal having an input frequency, wherein the frequency divider is configured to generate a plurality of corresponding phase-shifted signals. A retimer is coupled to the frequency divider and is configured to receive the phase-shifted signals and to generate multiplexer input signals for receipt by a multiplexer. The retimer is further configured to receive retimer control signals and to generate corresponding multiplexer control signals. The multiplexer is coupled to the retimer and has input terminals configured to receive the multiplexer input signals. The multiplexer is controlled by the multiplexer control signals so as to alternately and successively provide at its output terminal one of the multiplexer input signals. As the signal level of each phase-shifted signal transitions between a "high" position and a "low" position, the multiplexer control signals are configured to be employed at a time corresponding to the time when a phase-shifted signal experiences a transition.

14 Claims, 10 Drawing Sheets

GLITCH-FREE PHASE SWITCHING SYNTHESIZER

FIELD OF THE INVENTION

This invention relates to phase switching synthesizers, and more specifically to a system for generating signal frequencies by employing a retimer circuit which provides glitch-free operation.

BACKGROUND OF THE INVENTION

Many communication systems employ carrier frequencies in a GHz range. For example, HiPerLAN (High Performance Local Area Network) operates in the 5.2 GHz band (5.15 to 5.3 GHz) and consists of 5 channels spaced by 23.5294 MHz. One way to generate the carrier frequency is to use a phase-lock-loop frequency synthesizer, such as the one illustrated in FIG. 1.

FIG. 1 illustrates phase-lock-loop frequency synthesizer 70. A phase-lock-loop is an analog circuit that uses a negative feedback control loop to produce both an oscillator output frequency, which is synchronized with an input signal frequency, and an output voltage proportional to the input signal frequency changes. Specifically, FIG. 1 illustrates reference frequency 72 which is received at a first input terminal of phase detector 74. An output signal of phase detector 74 is received at an input terminal of voltage controlled oscillator (hereinafter referred to as "VCO") 76 via loop filter 75. VCO 76 generates synthesized output signal 78. In addition, the signal generated by VCO 76 is looped back to a second input terminal of phase detector 74 via programmable divider 82. Programmable divider is configured to receive input frequency 80 and to generate signal 84 having a frequency equal to input frequency 80 divided by D, wherein D is an integer.

In one prior art embodiment, programmable divider unit 82 employs two divide-by-2 counters and a multiplexer to achieve a programmable frequency counter. However, the control of the multiplexer, as will be explained in greater detail below, can generate glitches that effect the operation of the synthesizer. One way to avoid such glitches is to employ slow rising control signals which control the operation of the multiplexer. However, this is not an effective method for avoiding glitches.

Thus, there is a need for a phase-shifting frequency dividing synthesizer which provides glitch-free operation.

SUMMARY OF THE INVENTION

The present invention, according to one embodiment, relates to a frequency divider system for generating a glitch-free output signal having a programmable frequency. The system comprises a frequency divider unit for receiving a signal having an input frequency, wherein the frequency divider unit is configured to generate a plurality of phase-shifted, retimer input signals. A retimer is coupled to the frequency divider unit and is configured to receive the retimer input signals, and to generate phase-shifted multiplexer input signals for receipt by a multiplexer. The retimer is further configured to receive retimer control signals and to generate corresponding multiplexer control signals. The multiplexer is coupled to the retimer and has input terminals configured to receive the conveyed plurality of phase-shifted, multiplexer input signals. The control terminals of the multiplexer are controlled by the multiplexer control signals so as to alternately and successively receive, at a time corresponding to the multiplexer control signal, the phase-shifted multiplexer input signals.

Thus, as the waveform of each said phase-shifted signal transitions between a "high" position and a "low" position, the multiplexer control signals are configured to be employed within a window period corresponding to the time when a phase-shifted signal experiences a transition. Glitches in the output frequency are avoided because the retimer is configured to change the input terminal of the multiplexer simultaneously with the "low" to "high" transition of the signal being switched to. According to another embodiment, glitches in the output frequency are avoided because the retimer is configured to change the input terminal of the multiplexer after the "low" to "high" transition of the signal being switched to, but prior to the "high" to "low" transition of the signal being switched from. Thus, the retimer is configured so that the signal received by the multiplexer changes from a first phase-shifted signal to a second phase-shifted signal only if the signal level of the first and second phase-shifted signals are in a "high" position.

In accordance with one embodiment of the present invention, the system employs two divide-by-two frequency divider units so as to divide the input frequency by four. Thus, the frequency divider unit generates four phase-shifted retimer input signals, such as signals having phases shifted by 0, 90 180 and 270 degrees. The system may also further comprise a counter for receiving the output signal generated by the multiplexer. The counter may comprise a divide-by-N counter, wherein N is input by a user, such that the divided frequency corresponds to the input frequency divided by 4N+K, wherein N and K are programmable.

The system may also comprise a pulse generator coupled to the divide-by-N counter. The pulse generator is configured to receive the states of the counter and to generate K pulses per output cycle. The K pulses are received by a four-state machine coupled to the pulse generator, which is configured to change state upon receipt of each of the K pulses. A decoder is coupled to the four-state machine and is configured to generate, based upon a state of the four-state machine, the retimer control signals for receipt by the retimer.

BRIEF DESCRIPTION OF THE DRAWINGS

The subject matter regarded as the invention is particularly pointed out and distinctly claimed in the concluding portion of the specification. The invention, however, both as to organization and method of operation, together with features, objects, and advantages thereof may best be understood by reference to the following detailed description when read with the accompanying drawings in which:

DETAILED DESCRIPTION OF THE INVENTION

Figure 1:
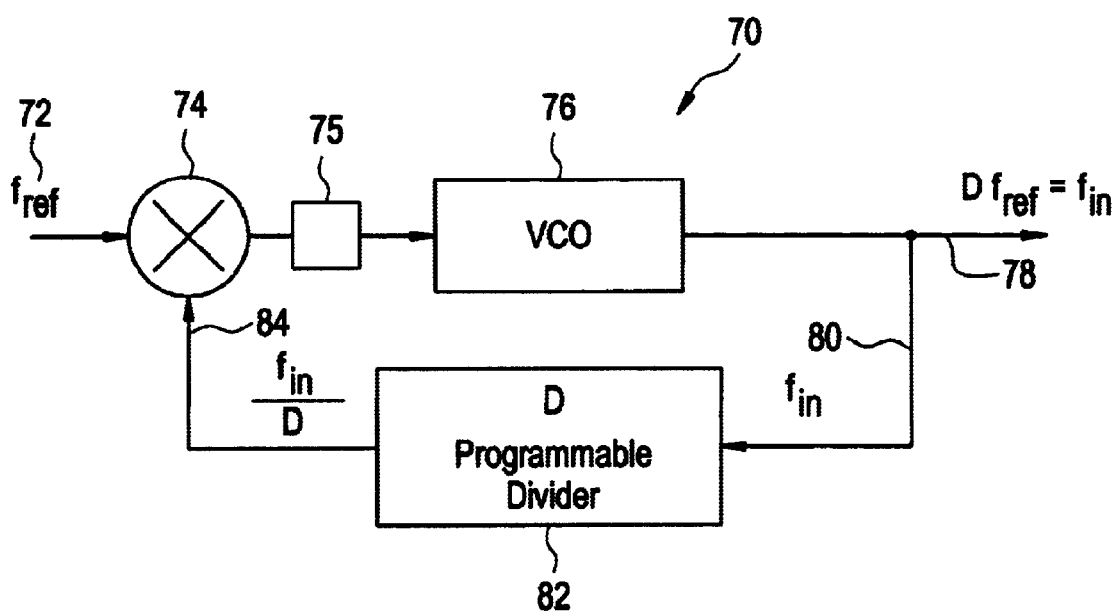
FIG. 1 illustrates a phase-lock-loop frequency synthesizer according to the prior art.
Figure 2:
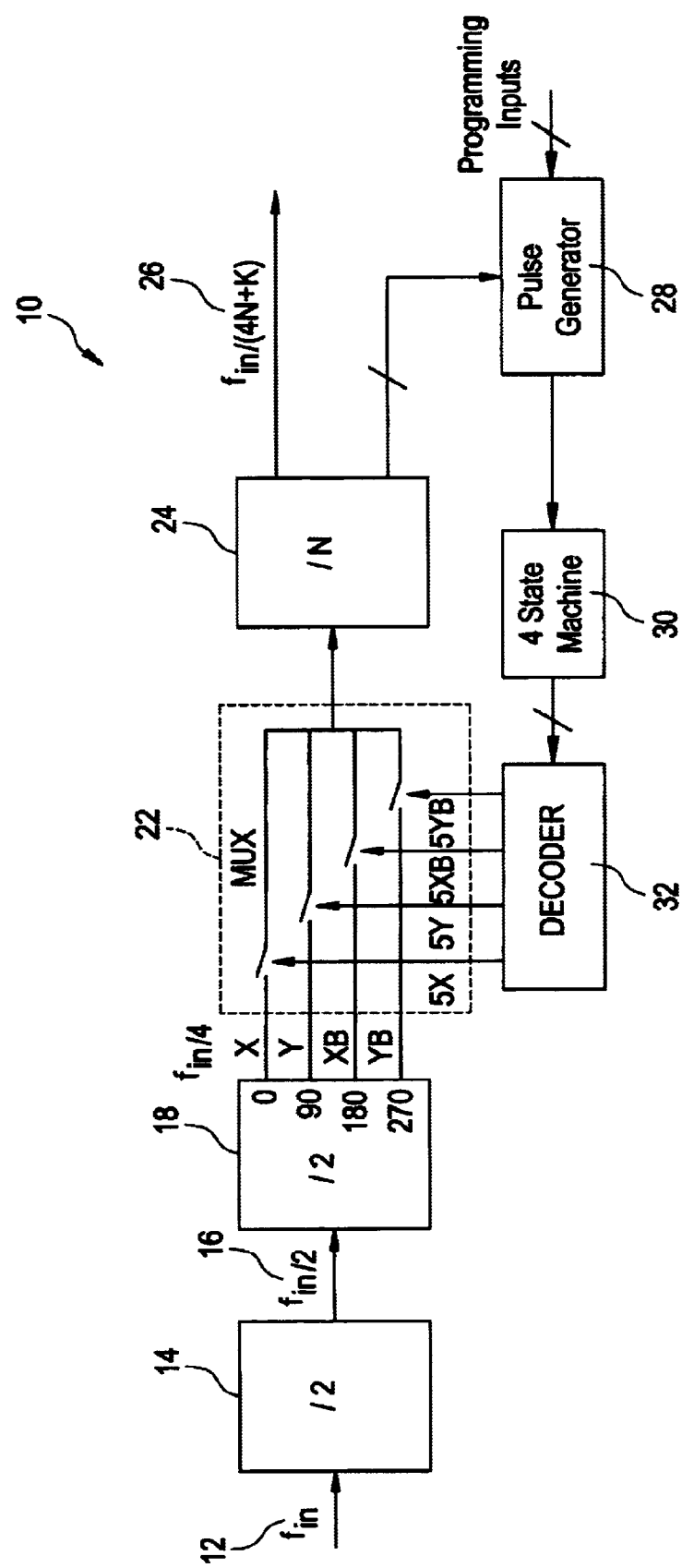
FIG. 2 illustrates an asynchronous programmable frequency divider according to the prior art.

FIG. 2 illustrates one embodiment of an asynchronous programmable frequency divider system. The frequency divider system is employed to generate output signal frequencies which have arbitrary division factors of an input signal frequency. For this purpose, a technique called "pulse swallowing" is employed and is accomplished by switching between different output phases of a frequency divider, as described in J. Craninckx and M. S. J. Steyaert, *A 1.75-Ghz/ 3V Dual Modulus Divide-By-128/129 Prescaler in 0.7-μm CMOS*, IEEE Journal of Solid Sate Circuits, vol. 31, no.7, pp. 890–897 (July 1996), which is incorporated by reference herein as fully as if set forth in its entirety.

In FIG. 2, synthesizer 10 is shown having an input signal 12, with a frequency $f_{in}$. Input signal 12 is received at an input terminal of divide-by-two frequency divider unit 14. An output terminal of stage 14 is coupled to an input terminal of a second divide-by-two frequency divider 18.

Second frequency divider unit 18 has four output terminals. Multiplexer input signals X, Y, XB, and YB are generated by frequency divider 18 and have phases shifted by 0, 90, 180 and 270 degrees respectively, for transmission to multiplexer 22. At any point in time, only one of the four output terminals of divider 18 is connected to the subsequent stage. Specifically, multiplexer 22 connects one of the output terminals of divider 18 to a divide-by-N counter 24. A first output terminal of counter 24 generates signal 26 having a desired frequency. In this case, the frequency is designated as $f_{in}/(4N+K)$. A second output terminal of counter 24 is coupled to pulse generator 28, which receives signals representing the various states of counter 24.

Pulse generator 28 receives programming inputs from a user and generates K pulses per output cycle, where K is set by the programming inputs. These K pulses per output cycle are received by four-state machine 30, which cycles through four states and is clocked by these pulses. Four-state machine 30 is coupled to decoder 32, which decodes the state of four-state machine 30, and generates four corresponding control signals, designated as SX, SY, SXB and SYB.

Each of these control signals SX, SY, SXB and SYB are coupled to and control the four control terminals of multiplexer 22. Thus, control signal SX is coupled to and controls the control terminal of multiplexer 22 so that input signal X is coupled to the output terminal of the multiplexer. Similarly, signal SY is coupled to and controls the control terminal of multiplexer 22 so that input signal Y is coupled to the output terminal of the multiplexer, signal SXB is coupled to and controls the control terminal of multiplexer 22 so that input signal XB is coupled to the output terminal of the multiplexer, and signal SYB is coupled to and controls the control terminal of multiplexer 22 so that input signal YB is coupled to the output terminal of the multiplexer. Thus, depending on the current state of four-state machine 30, decoder 32 switches "ON" the appropriate input switch of multiplexer 22 via one of the four control signals SX, SY, SXB or SYB.

Figure 3:
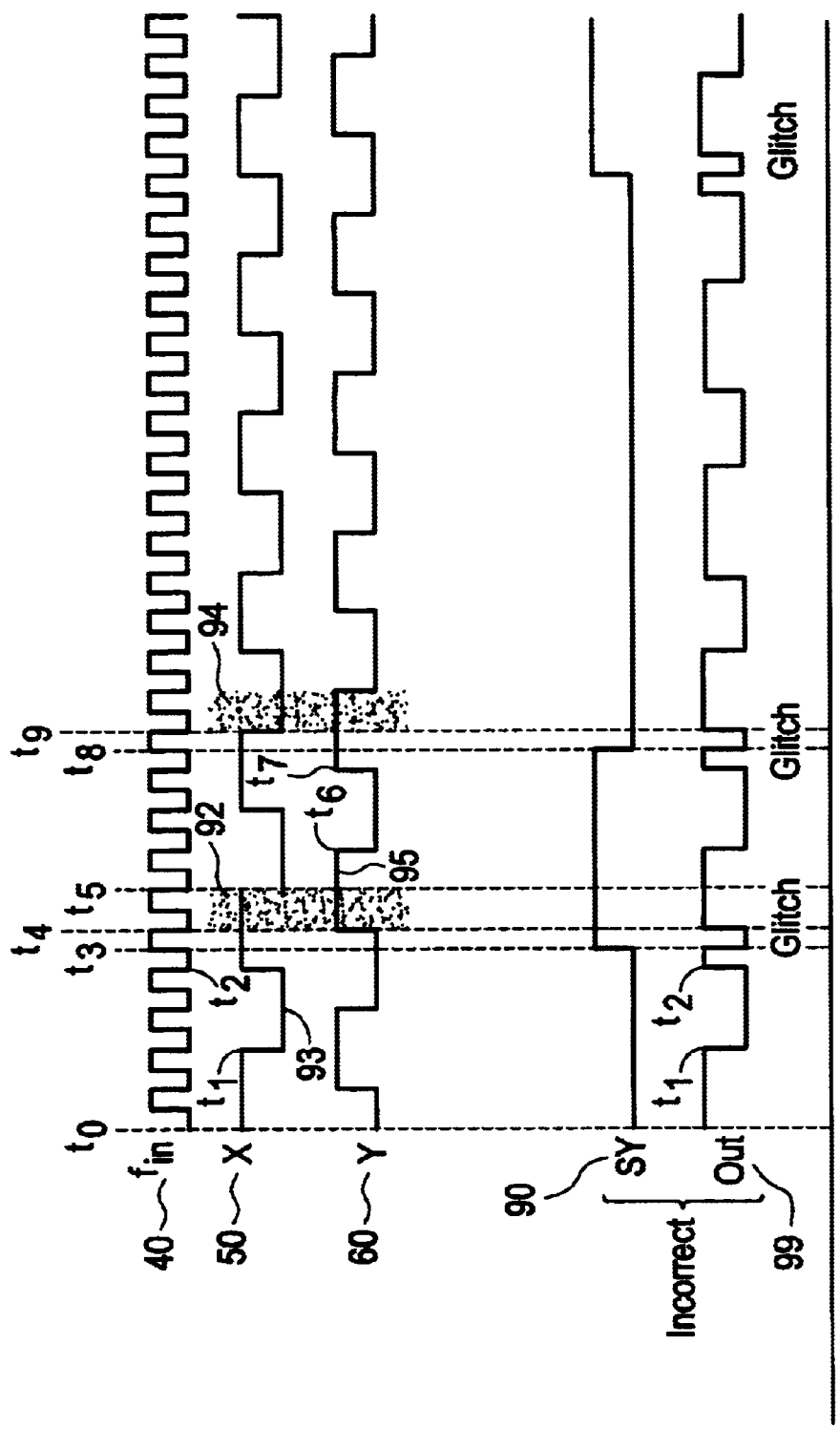
FIG. 3 is a waveform diagram that illustrates the operation of a synthesizer of the prior art.

FIG. 3 is a waveform diagram that illustrates the operation of synthesizer 10, wherein N=1, according to one embodiment of the prior art. Thus, when N=1 and pulse generator 28 is programmed to generate K=1 pulses per output cycle, the desired output signal has a frequency of $f_{in}/(4+1)$, or one-fifth the input frequency. To illustrate, waveform 40 of FIG. 3 shows the input frequency level received by first frequency divider 14. Upon being processed by frequency divider units 14 and 18, this input frequency is divided by four.

Waveform 50 illustrates signal X at one output terminal of frequency divider unit 18, wherein signal X has one-fourth the frequency of waveform 40. Waveform 60 illustrates signal Y at the second output terminal of frequency divider unit 18, wherein signal Y also has one-fourth the frequency of waveform 40. However, signal Y has a phase shift of 90 degrees relative to signal X. Although not shown, frequency divider unit 18 also generates signals XB and YB which respectively have phase shifts of 180 degrees and 270 degrees relative to waveform 50.

In each of waveforms 50 and 60, the parts 93 and 95 shown in thick lines denote the time when that particular waveform is directed to the output terminal of multiplexer 22. Those parts of the waveforms shown in thick lines are combined to form a final waveform, which has a frequency of fin/5 (the waveforms for XB and YB are also alternately directed to the output terminal of multiplexer 22, but are not shown). Phase switching is done once in each cycle of the output. Thus, input cycles can be "swallowed" by changing the control inputs of multiplexer 22 appropriately. The output of multiplexer 22 is used to clock divide-by-N counter 24.

Waveform 90, on the other hand, illustrates control signal SY as generated by decoder 32, in which the high-low transitions in the decoder signals do not occur at the perfect time. For example, the proper time for control signal SY to make a transition from "low" to "high" is when both X and Y signals are logically "high" as illustrated by shaded region 92 in FIG. 3. Furthermore, the proper time for signal SY to make a transition from "high" to "low" is when both Y and XB signals are logically "high", which occurs in the time range illustrated by shaded region 94 in FIG. 3. Although not shown, when control signal SY is "high", each of the other control signals are "low"—when control signal SY makes a transition from "high" to "low", the next control signal SXB is simultaneously making a transition from "low" to "high". Waveform 99 illustrates the output signal 26 of synthesizer 10 according to this actual embodiment and illustrates the occurrence of glitches (as will be explained in detail below).

As previously mentioned, the actual waveform generated by typical synthesizers of the prior art suffer from glitches. Referring to waveforms 50, 60 and 90 and 99 of FIG. 3, at time $t_0$, waveform 50 is originally directed to the output terminal of multiplexer 22. At time $t_1$, the multiplexer input signal shown as waveform 50 transitions to "low". Waveform 99, which illustrates actual output signal 26, also shows a transition to "low" at time $t_1$. At time $t_2$, waveform 50 continues to be directed to the output of multiplexer 22 and now transitions to "high". Again, waveform 99 shows a transition to "high" at time $t_2$.

At time $t_3$, decoder 32 prematurely changes control signal SY such that multiplexer input signal Y, as illustrated by waveform 60, is directed to the output terminal of multiplexer 22. Waveform 60 shows that, at $t_3$, multiplexer input signal Y has not yet transitioned to "high". As a result, and as shown in waveform 99, the multiplexer input signal directed to the output terminal of multiplexer 22 transitions to "low" at time $t_3$.

At $t_4$, the multiplexer input signal shown as waveform 60 transitions to "high". Since the multiplexer input signal shown as waveform 60 continues to be directed to the output terminal of multiplexer 22, the signal directed to the output terminal of multiplexer 22 also transitions to "high" at time $t_4$ (as also shown in waveform 99). Thus, a glitch results because, due to the incorrect timing of signal SY, two extra transitions occur (a "high-to-low" transition followed by a "low-to-high" transition). As synthesizer 10 continues to operate by successively changing the multiplexer input signal directed to the output terminal of multiplexer 22, output signal 99 continues to be generated with glitches. Waveform 99 shows another glitch which occurs when, at time $t_8$, signal SY transitions to "low" prior to time $t_9$. These glitches cause counter 24 (and thus synthesizer 10) to miscount, thereby resulting in an incorrect output signal frequency.

Figure 4:
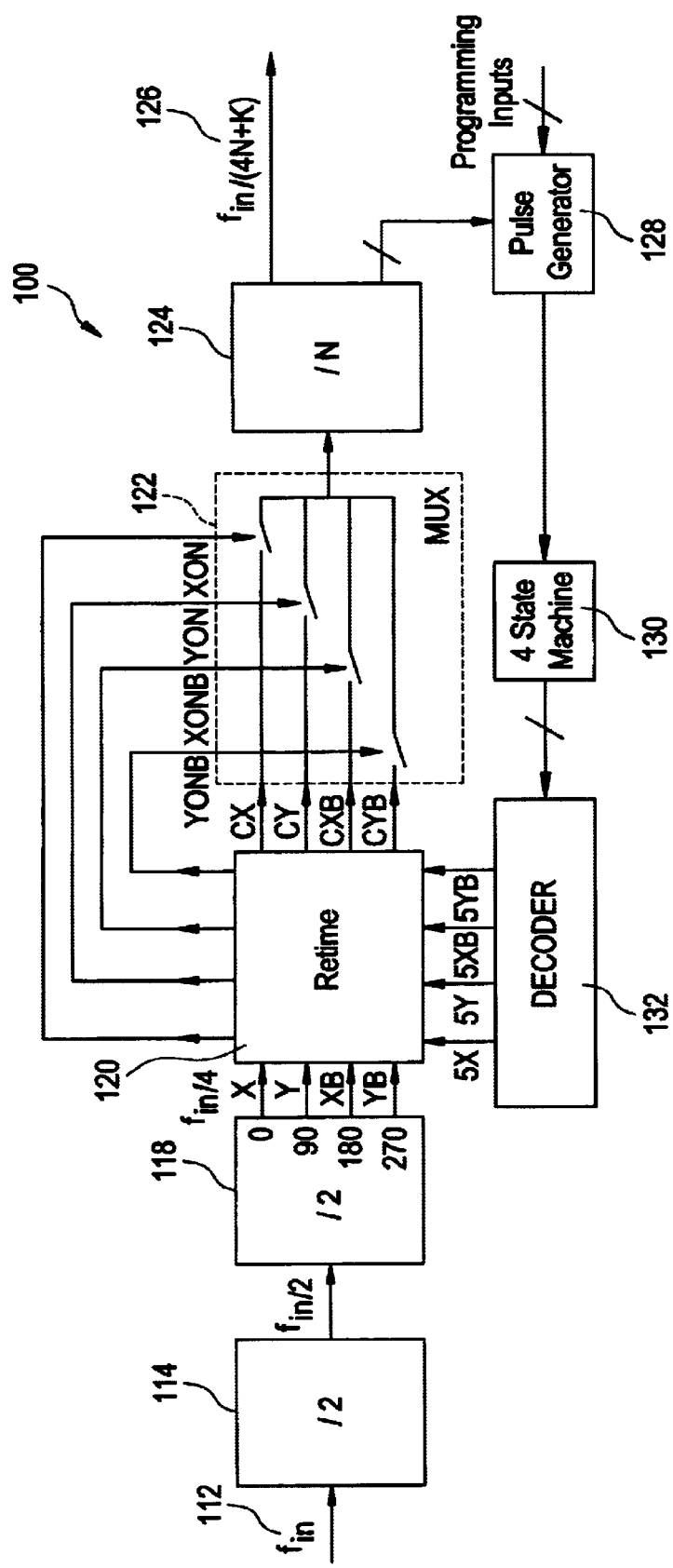
FIG. 4 illustrates a frequency synthesizer, according to one embodiment of the present invention.

FIG. 4 illustrates frequency synthesizer 100 which is employed to generate an output signal having a frequency which is a factor of an input signal frequency, according to one embodiment of the present invention. For instance, frequency synthesizer 100 is employed to generate an output signal having a frequency equal to $f_{in}/(4N+K)$, where N and K are programmable and $f_{in}$ is an input frequency. Synthesizer 100 also employs a "pulse swallowing" technique, which is accomplished by switching between different output phases of a frequency divider unit so as to avoid the transition to "low" of a current signal.

In FIG. 4, synthesizer 100 is shown having signal 112, with frequency $f_{in}$. Input signal 112 is received at an input terminal of first divide-by-two frequency divider unit 114, which divides the frequency of input signal 112 by two. First frequency divider unit 114 may comprise a flip-flop. An output terminal of frequency divider unit 114 is coupled to an input terminal of a second divide-by-two frequency divider unit 118.

Second frequency divider unit 118 receives the divided frequency from first divide-by-two frequency divider 114 and divides it by two again, resulting in the input signal now being divided by four. Second frequency divider 118 has four output terminals which transmit retimer input signals X, Y, XB and YB, each having a divided frequency and having phases shifted by 0, 90, 180 and 270 degrees respectively.

The phase-shifted retimer input signals are transmitted to four corresponding input terminals of a retimer 120. The operation of retimer 120 will be discussed in greater detail below. Retimer 120, on the other hand, has four output terminals which provide retimed multiplexer input signals CX, CY, CXB, and CYB. Retimed multiplexer input signals CX, CY, CXB and CYB all have the same divided frequency as the signals received by retimer 120, and also have phases shifted by 0, 90, 180 and 270 degrees respectively, and are received at four corresponding input terminals of multiplexer 122. At any point in time, only one output terminal of retimer 120 is coupled so as to transmit its corresponding phase-shifted signal to a following stage 124 via multiplexer 122.

The output terminal of multiplexer 122 is coupled to divide-by-N counter 124. A first output terminal of counter 124 generates output signal 126 having the desired programmable frequency. In this embodiment, the frequency is designated as $f_{in}/(4N+K)$, wherein N and K are programmable. A second output terminal of counter 124 is coupled to a pulse generator 128.

Pulse generator 128 receives programming input signals so as to generate K pulses per output cycle, where K is preferably an integer. These K pulses per output cycle are received by four-state machine 130, which cycles through four states and is clocked by these pulses. Four-state machine 130 is coupled to decoder 132, which decodes the state of four-state machine 130, and generates four corresponding retimer control signals, designated as SX, SY, SX,B and SYB. Depending on which one of the four states the machine is currently in, the retimer control signals sent by decoder 132 to retimer 120 indicate to retimer 120 which phase-shifted multiplexer input signal is to be connected to the output terminal of multiplexer 122. For instance, in a first state, decoder 132 sends retimer control signal SX to retimer 120, and retimer 120 is configured to cause multiplexer input signal CX to connect to the output terminal of multiplexer 122.

Retimer 120 is also configured to generate four multiplexer control signals, designated as XON, YON, XONB and YONB. Each of these multiplexer control signals is coupled to and control the four input switches of multiplexer 122. Specifically, these multiplexer control signals control the connection to the output terminal of multiplexer 122 of the various phase-shifted multiplexer input signals. Thus, multiplexer control signal XON is coupled to and controls the connection of multiplexer input signal CX to the output terminal of multiplexer 122. Similarly, signal YON is coupled to and controls the connection to the output terminal of multiplexer 122 of signal CY, signal XONB is coupled to and controls the connection to the output terminal of multiplexer 122 of signal CXB, and signal YONB is coupled to and controls the connection to the output terminal of multiplexer 122 of signal CYB. Retimer 120 is configured such that each of the four multiplexer control signals XON, YON, XONB and YONB activate the input switches of multiplexer 122 so as to correspond to the high-low transitions (or a window period corresponding to the high-low transitions) of multiplexer input signals CX, CY, CXB and CYB, as will be explained below.

Figure 5:
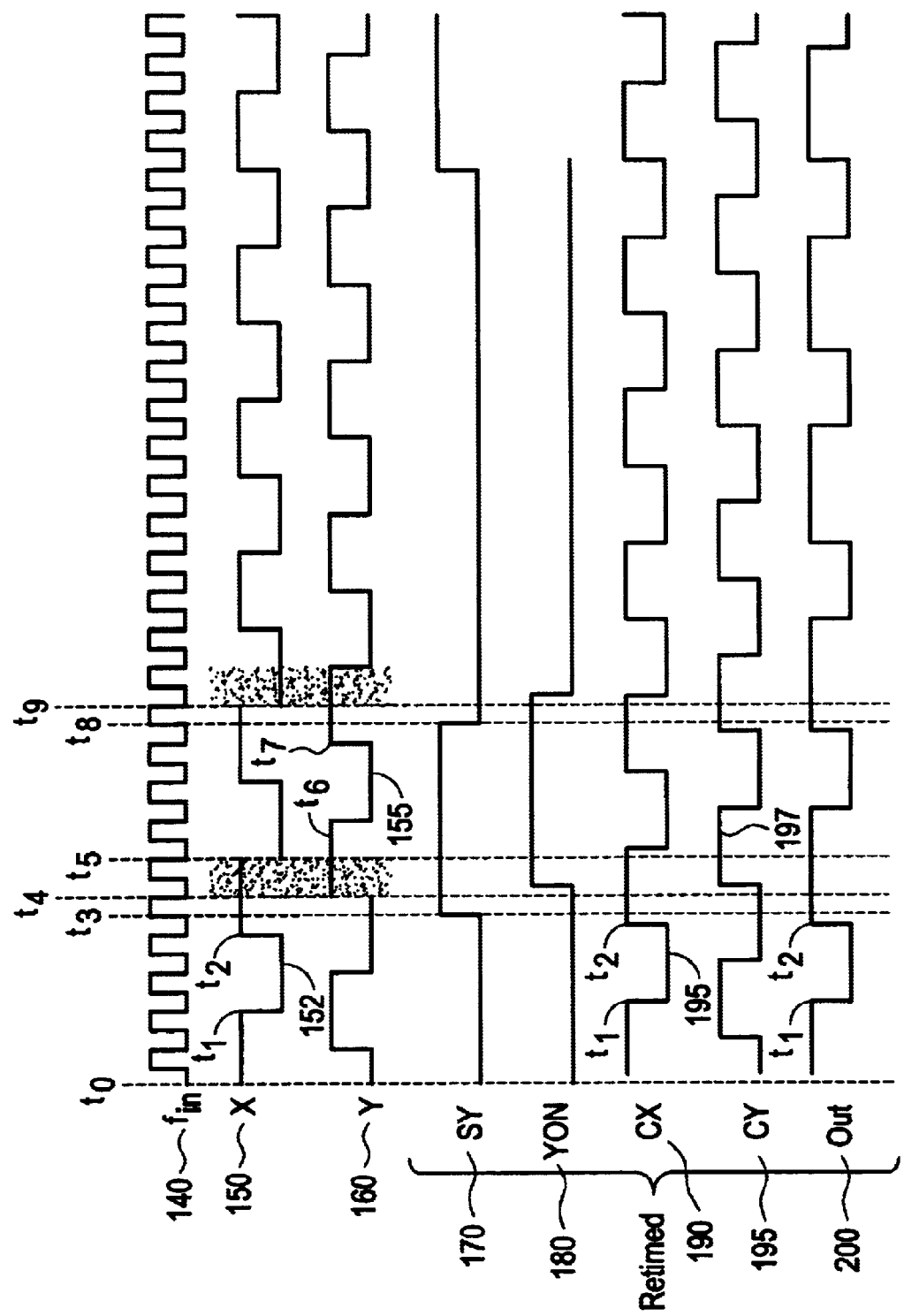
FIG. 5 is a waveform diagram that illustrates the operation of the synthesizer, according to one embodiment of the present invention.

FIG. 5 is a waveform diagram that illustrates the operation of synthesizer 100, according to one embodiment of the invention. When N=1 and pulse generator 128 is programmed to generate K=1 pulses per output cycle, the desired output signal has a frequency of $f_{in}/(4N+K)$, or one-fifth the input frequency. To illustrate, waveform 140 of FIG. 5 shows the input frequency received by first frequency divider unit 114. Upon being processed by frequency divider units 114 and 118, the input frequency is divided by four, as shown in waveforms 150 and 160.

Waveform 150 illustrates signal X of one output terminal of frequency divider unit 118, having one-fourth the frequency of waveform 140. Waveform 160, on the other hand, illustrates signal Y of the second output terminal of frequency divider unit 118, also having one-fourth the frequency of waveform 140. However, signal Y has a phase shift of 90 degrees relative to signal X. Although not shown, frequency divider unit generates additional signals XB and YB respectively having phase shifts of 180 degrees and 270 degrees relative to waveform 150.

In each of waveforms 150 and 160, the parts 152 and 155 shown in thick lines denotes the time when that particular waveforms are intended to be directed to the output of multiplexer 122. Those parts of the waveforms shown in thick lines are combined to form final waveform 200, which has a frequency of $f_{in}/5$. Phase switching is done once in each cycle of the output. Thus, input cycles are "swallowed" by changing the control inputs of multiplexer 122 appropriately. The output of multiplexer 122 is used to clock divide-by-N counter 124.

Waveform 170 illustrates retimer input control signal SY as generated by decoder 132, according to one embodiment of the invention. Waveform 170 is identical to waveform 90 shown in FIG. 3 in that the premature transitions in signal SY do not occur at the perfect time. As previously mentioned, the perfect time exists for control signal SY to go "high" when the signals generated by frequency divider unit 118 are both "high". Although not shown, decoder 132 generates additional waveforms SX, SXB and SYB, each of which successively and alternately transition to "high".

Waveform 180 illustrates the frequency of multiplexer control signal YON, according to one embodiment of the invention. As previously mentioned, retimer 120 generates multiplexer control signal YON to control the input terminal of multiplexer 122 that receives signal CY. Specifically, retimer 120 generates signal YON to control the connection to the output terminal of multiplexer 122 of multiplexer input signal CY. Although not shown, additional waveforms exist for multiplexer control signals XON, XONB and YONB, which also successively and alternately transition from "low" to "high". Thus, when any one multiplexer control signal is "high", all of the other three multiplexer control signals are "low". When one multiplexer control signal transitions from "low" to "high", another of the three multiplexer control signals is simultaneously transitioning from "high" to "low".

Waveforms 190 and 195, on the other hand, illustrate the waveform of phase-shifted, multiplexer input signals CX and CY as conveyed by retimer 120, according to one embodiment of the invention. Waveforms 190 and 195 correspond to waveforms 150 and 160 as discussed above, since retimer 120 is configured to generate multiplexer input signals CX and CY from received retimer input signals X and Y, respectively. Although not shown, retimer 120 is also configured to generate additional waveforms for phase-shifted, multiplexer input signals CXB and CYB, which correspond to received phase-shifted signals XB and YB, respectively. Those parts 193 and 197 of waveforms 190 and 195 shown in thick lines are combined to form final waveform 200. Waveform 200 illustrates the output signal 1126 of synthesizer 100 according to one embodiment, and illustrates how the occurrence of glitches are prevented.

Referring to FIG. 5, at time $t_0$, phase-shifted retimer input signal X as shown in waveform 150 is originally received by retimer 120, and delayed multiplexer input signal CX of retimer 120 is directed to the output of multiplexer 122. At time $t_1$, multiplexer input signal CX transitions to "low" as shown in waveform 190. Waveform 200, which illustrates the output signal of synthesizer 100, also shows a transition to "low" at time $t_1$. At time $t_2$, multiplexer input signal CX shown in waveform 50 continues to be directed to the output terminal of multiplexer 122 and now transitions to "high". Again, waveform 200 shows a transition to "high" at time $t_2$.

At $t_3$, retimer control signal SY as shown in waveform 170 transitions to "high". Thus, decoder 132 signals to retimer 120 to change the control input of multiplexer 122, so that signal CY having the signal illustrated by waveform 160 is directed to the output terminal of multiplexer 122. However, as shown in FIG. 3, if retimer 120 changes the control input of multiplexer 122 at time $t_3$, a glitch will occur in output signal 126 due to the fact that multiplexer signal CY has not yet transitioned to "high".

At $t_4$, or shortly thereafter, multiplexer control signal YON transitions to "high", as shown in waveform 180.

Thus, retimer 120 generates signal YON in order to change the control input of multiplexer 122 so that signal CY is directed to the output terminal of multiplexer 122. As shown in waveform 195, time $t_4$ also coincides with the time that signal CY transitions to "high". Thus, instead of changing the input of multiplexer 122 at $t_3$ when a glitch can occur, retimer 120 changes the input of multiplexer 122 at $t_4$ so as to avoid the occurrence of a glitch. The glitch does not occur because retimer 120 is configured to switch the connection of the input terminal of multiplexer 122 to its output terminal simultaneously with the transition of signal CY from "low" to "high". It is also noted that according to another embodiment of the invention, retimer 120 is configured to change the signal which is received by the output terminal of multiplexer 122 after the transition of signal CY from "low" to "high" but prior to the transition of signal CX from "high" to "low". Thus, retimer 120 changes the input terminal of multiplexer 122 prior to time $t_5$, since signal CX transitions from "high" to "low" at time $t_5$.

Between time $t_4$ and $t_8$, multiplexer input signal CY shown as waveform 195 continues to be directed to the output terminal of multiplexer 122 because multiplexer control signal YON is activated during this time range. Thus, output signal 200 transitions to "low" at time $t_6$ and transitions to "high" at time $t_7$. The proper time for deactivating multiplexer control signal YON is when multiplexer input signals CY and CXB are both "high", based upon the same principle as explained above in connection with the waveform diagram shown in FIG. 3.

Thus, synthesizer 100 continues to operate by successively changing the phase-shifted multiplexer input signal which is directed to the output terminal of multiplexer 122 to generate the output signal shown by waveform 200. In the embodiment shown, the output signal has a frequency which is one-fifth the frequency of signal $f_{in}$ shown by waveform 140. Output signal 126 shown in waveform 200 does not experience glitches as suffered by the typical synthesizers of the prior art.

Figure 6:
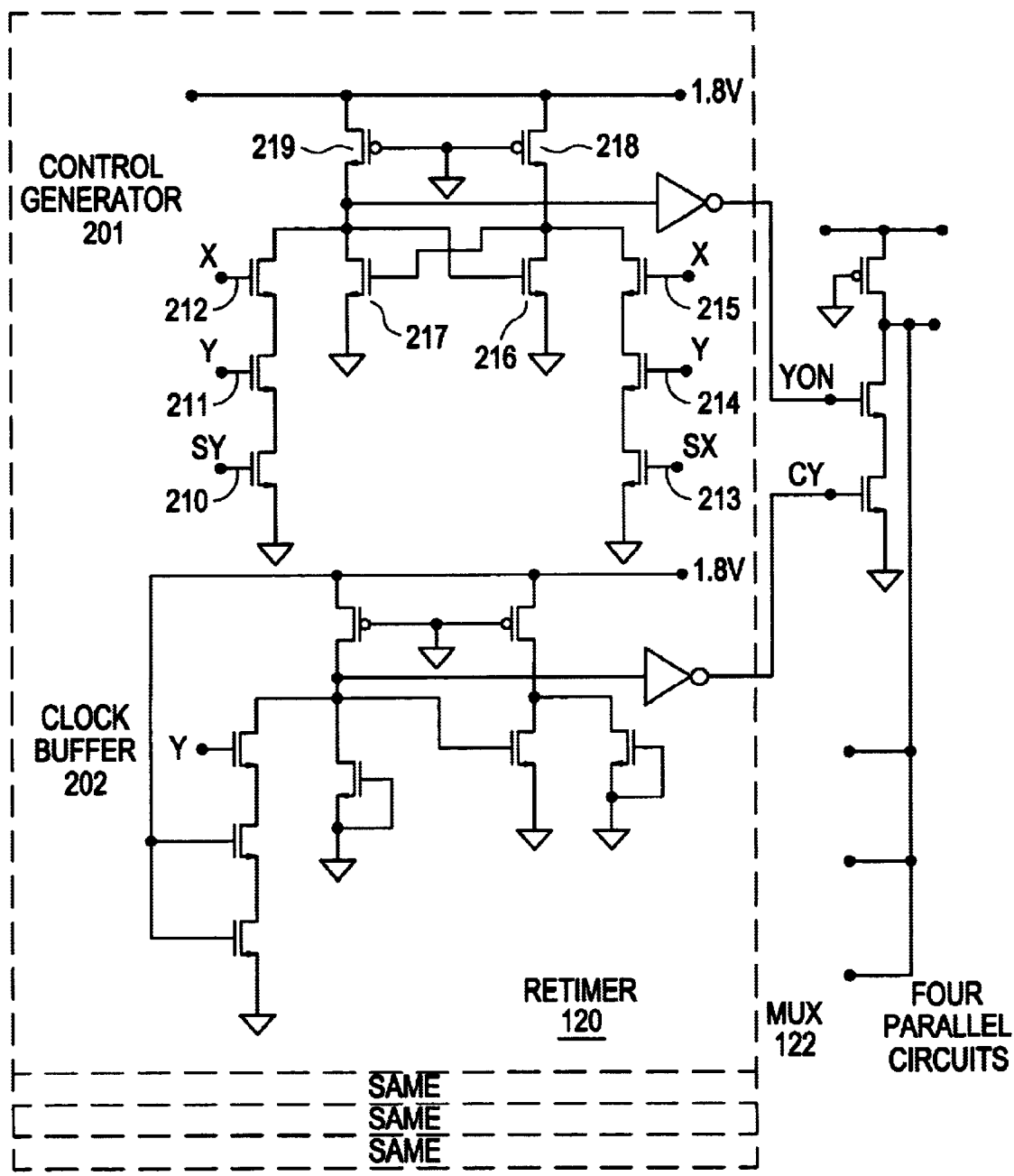
FIG. 6 is a circuit diagram employing pseudo-nMOS logic that illustrates the retimer circuit, according to one embodiment of the present invention.

FIG. 6 is a circuit diagram employing pseudo-nMOS logic that illustrates retimer circuit 120, according to one embodiment of the invention. FIG. 6 shows one cross-coupled latch, designated as control generator 201, an output terminal of which is coupled to one of the control terminals of multiplexer 122, and clock buffer arrangement 202 coupled to one of the four input terminals of multiplexer 122. Although not shown, retimer circuit 120 when employed in this arrangement, comprises four such cross-coupled latches and clock buffer arrangements, respectively coupled to one of the control and input terminals of multiplexer 122.

Specifically, FIG. 6 shows that control generator 201 comprises transistors 210, 211 and 212, which receives signals SY, Y and X respectively. The drain terminal of transistor 212 is coupled to the drain terminal of transistor 217 and to the gate terminal of transistor 216. Similarly, generator 201 further comprises transistors 213, 214 and 215, which receive signals SXB, Y and XB respectively. The drain terminal of transistor 215 is coupled to the drain terminal of transistor 216 and to the gate terminal of transistor 217. Furthermore, the drain terminals of transistors 216 and 217 are coupled to p-MOS transistors 218 and 219, respectively so as to form the cross-coupled latch.

In order to have both multiplexer input signal CY and multiplexer control signal YON arrive at the input terminals of multiplexer 122 at the same time, clock buffer 202 is employed. The delay in buffer 202 is the same as that of control signal generator 201. According to the embodiment shown, the output terminal of a cross-coupled latch YON controls multiplexer 122 so as to couple multiplexer input signal CY to the output terminal of the multiplexer. The output of the latch is pulled high if both retimer input signals X and Y are high and signal SY is high (i.e.—decoder 132 of FIG. 3 selects signal Y). Conversely, the output of the latch is pulled low when both signals Y and XB are high and signal SXB is high (i.e.—decoder 132 of FIG. 3 selects signal XB). The operation of retimer 120, as shown in this embodiment, is illustrated in waveforms 170 though 200 in FIG. 4.

Figure 7:
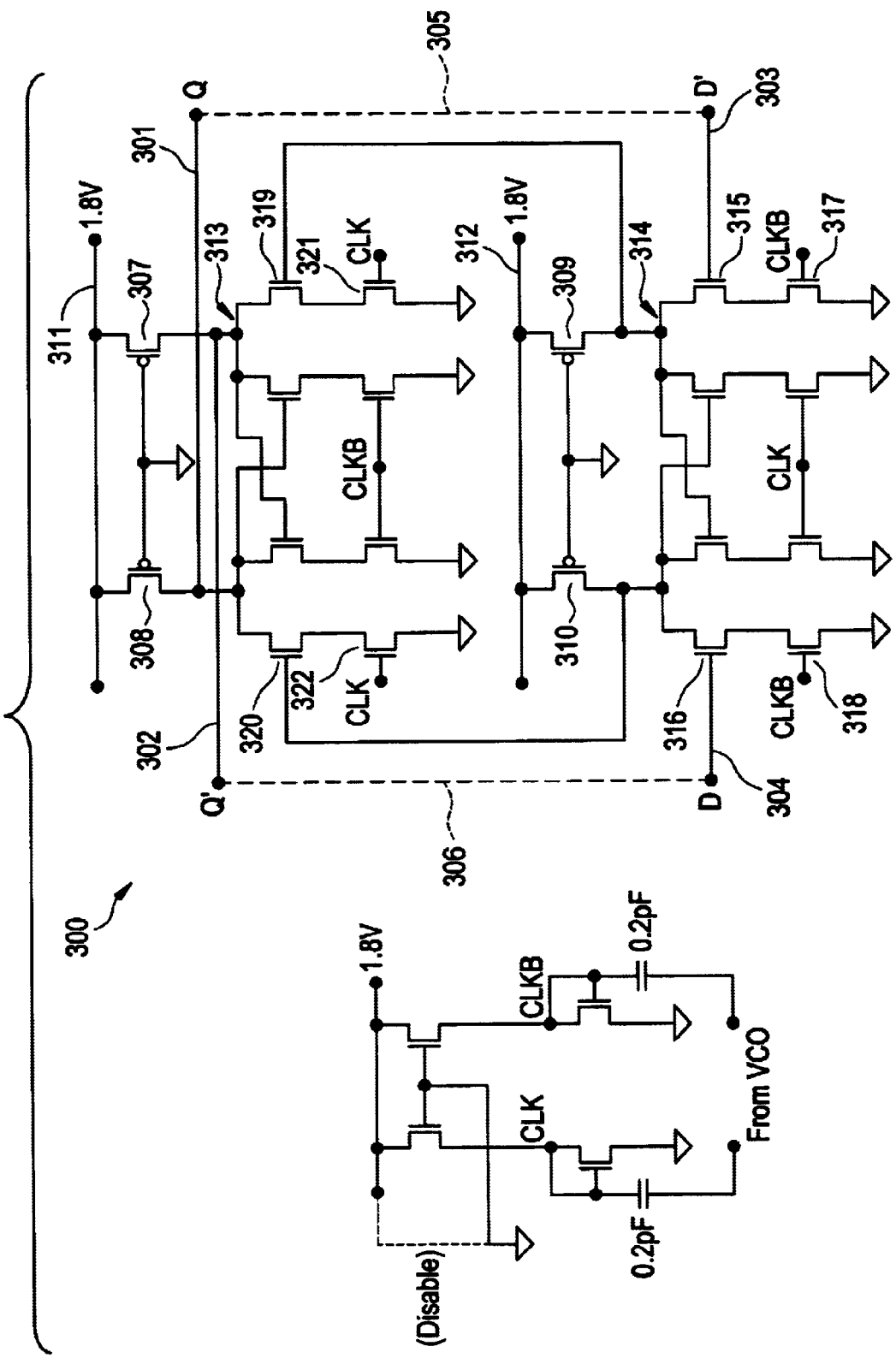
FIG. 7 is a circuit diagram of a divide-by-two divider employing pseudo-nMOS logic, according to one embodiment of the present invention.

FIG. 7 is a circuit diagram of a divide-by-two divider unit employing pseudo-nMOS logic, according to another embodiment of the invention. Specifically, FIG. 7 shows a master-slave D flip-flop 300 whose output terminals 301 and 302 are connected back to its input terminals 303 and 304 respectively (shown as dashed lines 305 and 306). Clock signals CLK and CLKB, according to one embodiment, are ac coupled through 0.2 pF capacitors. The dc level is set using an inverter whose input is tied to its output.

Flip-flop 300 further comprises pMOS transistors 307 and 308, the gate terminals of which are coupled to ground. The source terminals of transistors 307 and 308 are coupled to voltage supply source 311, while the drain terminals are coupled to a cross coupled latch 313. In addition, the drain terminals of transistors 307 and 308 are coupled to the gate terminals of transistors 316 and 315 of cross-coupled latch 314, respectively. Transistors 315 and 316 are connected in series to transistors 317 and 318, which are configured to receive at their gate terminals signals CLKB.

Similarly, flip-flop 300 further comprises pMOS transistors 309 and 310, the gate terminals of which are coupled to ground, the source terminals of which are coupled to voltage supply source 312, and the drain terminals of which are coupled to a cross coupled latch 314. The drain terminals of transistors 309 and 310 are also coupled to the gate terminals of transistors 319 and 320 of cross-coupled latch 313, respectively. Transistors 319 and 320 are connected in series to transistors 321 and 322, which are configured to receive at their gate terminals signal CLK.

Figure 8:
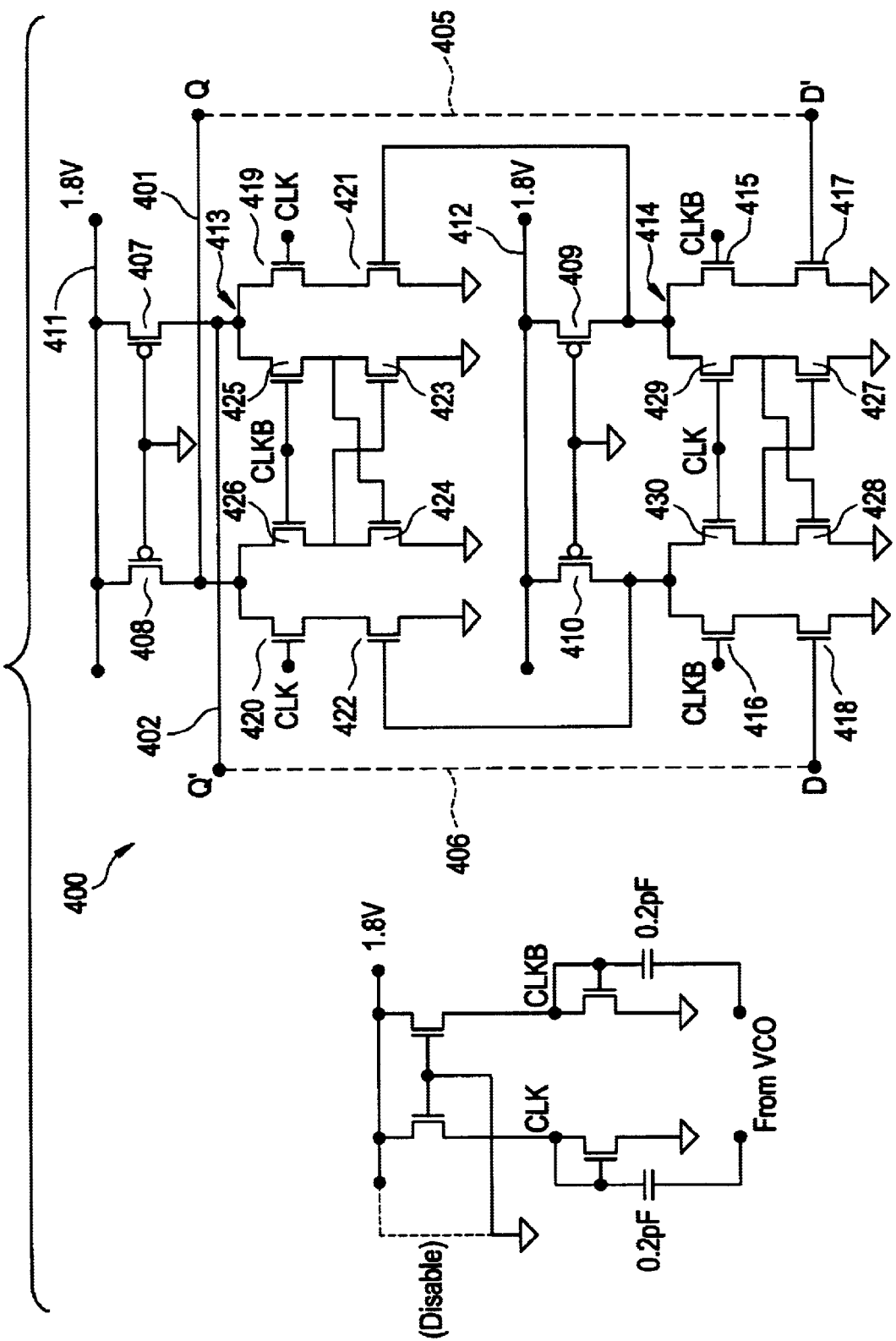
FIG. 8 is a circuit diagram of a divider employing pseudo-nMOS logic, according to another embodiment of the invention.

FIG. 8, on the other hand, shows a flip-flop 400 which is similar to the flip-flop illustrated in FIG. 7, except that the output terminals Q and Q' are coupled to the gate terminals of transistors 418 and 417, respectively, while signal CLKB is received at the gate terminals of transistors 415 and 416. Flip-flop 400 further comprises p-MOS transistors 407 and 408, the gate terminals of which are coupled to ground. The source terminals of transistors 407 and 408 are coupled to voltage supply source 411, white the drain terminals are coupled to a cross coupled latch 413.

In this embodiment, cross-coupled latch 413 comprises transistors 423 and 424 having their gate terminals coupled to each other's respective source terminals and their drain terminals coupled to ground. The source terminals of transistors 423 and 424 are also coupled to the drain terminals of transistors 425 and 426, respectively, which are coupled at their gate terminals to receive signal CLKB. Transistors 417 and 418 are connected in series to transistors 415 and 416, which are configured to receive at their gate terminals signals CLKB.

Similarly, flip-flop 400 further comprises p-MOS transistors 409 and 410, the gate terminals of which are coupled to ground, the source terminals of which are coupled to voltage supply source 412, and the drain terminals of which are coupled to a cross-coupled latch 414. The drain terminals of transistors 409 and 410 are also coupled to the gate terminals of transistors 421 and 422 of cross-coupled latch 413, respectively. Similar to latch 413, in this embodiment, cross-coupled latch 414 comprises transistors 427 and 428 having their gate terminals coupled to each other's respective source terminals and their drain terminals coupled to ground. The source terminals of transistors 427 and 428 are also-coupled to the drain terminals of transistors 429 and 430, respectively, which are coupled at their gate terminals to receive signal CLK.

Figure 9A:
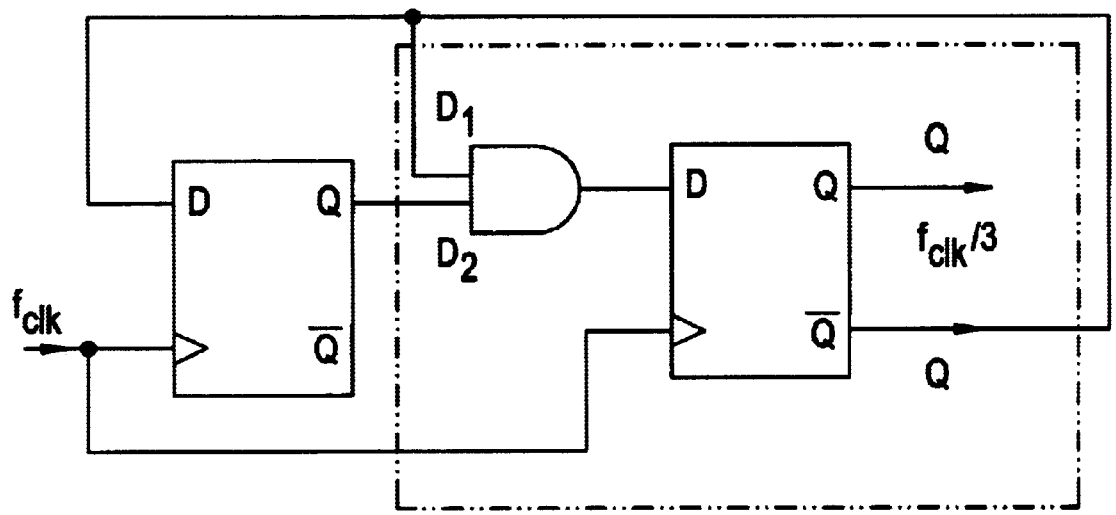
FIGS. 9(a) and 9(b) illustrate a divide-by-three stage, according to another embodiment of the present invention.
Figure 9B:
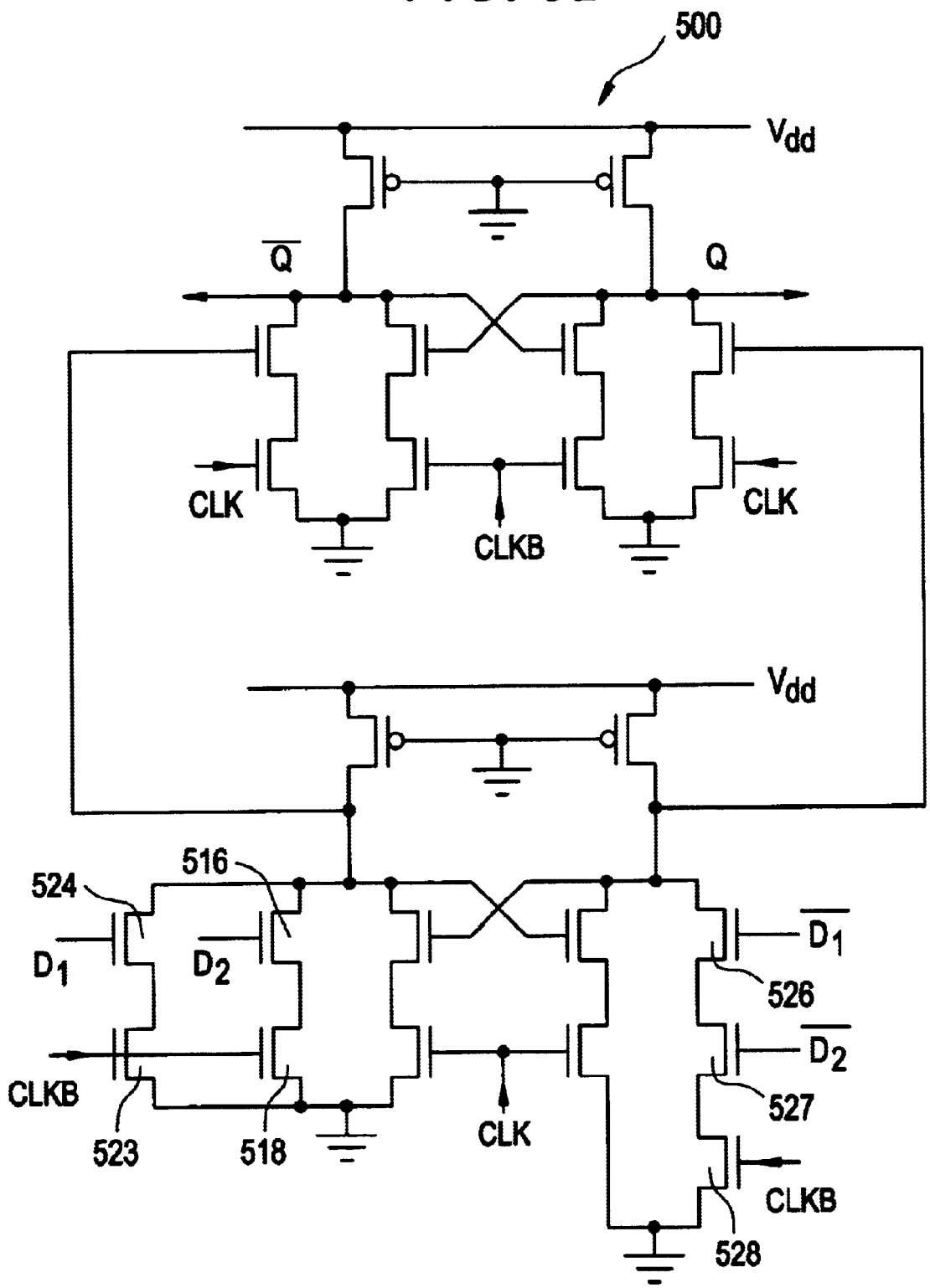

FIGS. 9(a) and 9(b) illustrate a divide-by-three stage, in accordance with still another embodiment of the present invention. FIG. 9(a) is a logic diagram employing conventional logic symbols, while FIG. 9(b) is a circuit diagram that shows one such implementation. Specifically, circuit 500 of FIG. 9(b) is similar to flip-flop 400 shown in FIG. 8, but has additional transistors 523 and 524.

The gate terminal of transistor 523 is coupled to receive signal CLKB, which is also received at a gate terminal of transistor 518. The source terminal of transistor 523 is coupled to the drain terminal of transistor 524, the gate terminal of which is coupled to receive signal $D_1$. The source terminal of transistor 524 is coupled to the source terminal of transistor 516. The gate terminal of transistor 516 is coupled to receive signal $D_2$. In addition, circuit 500 comprises transistors 526, 527 and 528, which are coupled in series. The gate terminals of transistors 526, 527 and 528 are coupled to receive signals $D_1B$, $D_2B$, and CLKB, respectively.

While only certain features of the invention have been illustrated and described herein, many modifications, substitutions, changes or equivalents will now occur to those skilled in the art. It is therefore, to be understood that the appended claims are intended to cover all such modifications and changes that fall within the true spirit of the invention.

We claim:

1. A system for generating a glitch-free output signal having a frequency, said system comprising:
   a frequency divider unit for receiving a signal having an input frequency, said frequency divider unit configured to generate a plurality of phase-shifted signals;
   a retimer coupled to said frequency divider unit and configured to receive said phase-shifted signals and to generate multiplexer input signals, to receive retimer control signals to generate corresponding multiplexer control signals that correspond to a time when a phase-shifted signal experiences a transition, and to change the multiplexer input signal which is connected to an output terminal of said multiplexer simultaneously with the "low" to "high" transition of the phase-shifted signal being switched to; and
   a multiplexer coupled to said retimer and having input terminals configured to receive said multiplexer input signals, wherein said multiplexer is controlled by said multiplexer control signals so as to alternately and successively provide at its output terminal one of said multiplexer input signals.

2. A system for generating a glitch-free output signal having a frequency, said system comprising:
   a frequency divider unit for receiving a signal having an input frequency, said frequency divider unit configured to generate a plurality of phase-shifted signals;
   a retimer coupled to said frequency divider unit and configured to receive said phase-shifted signals and to generate multiplexer input signals, to receive retimer control signals to generate corresponding multiplexer control signals that correspond to a time when a phase-shifted signal experiences a transition, and to change the multiplexer input signal which is connected to an output terminal of said multiplexer after the "low" to "high" transition of the phase-shifted signal being switched $t_0$, but prior to the "high" to "low" transition of the phase-shifted signal being switched from; and a multiplexer coupled to said retimer and having input terminals configured to receive said multiplexer input signals, wherein said multiplexer is controlled by said multiplexer control signals so as to alternately and successively provide at its output terminal one of said multiplexer input signals.

3. The system according to claim 2, wherein said retimer is configured so that said multiplexer input signal which is connected to an output terminal of said multiplexer changes from a first phase-shifted signal to a second phase-shifted signal only if said first and second phase-shifted signals are in a "high" position.

4. The system according to claim 1, wherein said frequency divider unit divides said input frequency by four.

5. The system according to claim 1, wherein said frequency divider unit comprises two divide-by-two frequency divider units.

6. The system according to claim 4, wherein said frequency divider unit generates four phase-shifted signals.

7. The system according to claim 4, wherein said phase-shifted signals generated by said frequency divider unit have phases shifted by 0, 90 180 and 270 degrees.

8. The system according to claim 7, wherein said system further comprises a counter for receiving said output signal generated by said multiplexer.

9. The system according to claim 8, wherein said counter is a divide-by-N counter, wherein N is programmable.

10. The system according to claim 9, wherein said counter comprises a first output terminal for outputting said divided frequency, wherein said divided frequency corresponds to said input frequency divided by 4N+K, wherein K is programmable.

11. The system according to claim 10, wherein said counter comprises a second output terminal for providing signals representing states of said counter.

12. The system according to claim 11, wherein said system further comprises a pulse generator coupled to said divide-by-N counter and configured to receive said signals representing states of said counter and to generate K pulses per output cycle.

13. The system according to claim 12, wherein said system further comprises a four-state machine coupled to said pulse generator and configured to change state upon receipt of each of said K pulses.

14. The system according to claim 12, wherein said system further comprises a decoder coupled to said four-state machine and configured to generate, based upon a state of said four-state machine, said retimer control signals for receipt by said retimer.

* * * * *